United States Patent [19]

Aigo

[11] Patent Number: 4,791,880

[45] Date of Patent: Dec. 20, 1988

[54] DEVICE FOR DEVELOPING TREATMENT OF SEMICONDUCTOR MATERIALS

[76] Inventor: Seiichiro Aigo, 3-15-13, Negishi, Daito-ku, Tokyo, Japan

[21] Appl. No.: 51,335

[22] Filed: May 19, 1987

[30] Foreign Application Priority Data

May 19, 1986 [JP] Japan .................. 61-114448

[51] Int. Cl.$^4$ ........................... B05C 3/09; B05C 3/18
[52] U.S. Cl. ..................................... 118/50; 118/52; 118/416; 118/421; 118/429
[58] Field of Search ............... 118/50, 52, 54, 416, 118/421, 429

[56] References Cited

U.S. PATENT DOCUMENTS 4,590,094  5/1986  Ringer, Jr. .................. 118/52 X
4,640,846  2/1987  Kuo .............................. 118/52 X
4,655,162  4/1987  Kameyama ................... 118/416 X Primary Examiner—John McIntosh
Attorney, Agent, or Firm—Wegner & Bretschneider

[57] ABSTRACT

A device for developing treatment of a semiconductor material which is provided with a cup-shaped basin having a liquid inlet passage in its center portion and an annular flat upper portion and a chuck positioned above the basin and having a lower end surface for supporting the semiconductor material to be developed, the basin being provided on its upper portion with a ring for temporarily storing the developing liquid supplied to the upper portion of the basin, the ring having a diameter larger than the size of the semiconductor material and the passage being provided with an automatically operable valve.

5 Claims, 4 Drawing Sheets

DEVICE FOR DEVELOPING TREATMENT OF SEMICONDUCTOR MATERIALS

BACKGROUND OF THE INVENTION (1) Field of the Invention

This invention relates to a treatment device for developing films, such as oxide film, applied to semiconductor materials, such as silicon wafers, glass photomasks or the like.

(2) Description of the Prior Art

In the production of semiconductor circuits, semiconductor wafers consisted of silicon, for example, are subjected to the application thereto of film, such as oxide film, and the film on the wafer is then subjected to etching treatment for the purpose of selectively osmosing a N- or P-type diffusion material into the surface. In order to form a pattern of circuit, a photosensitive liquid (photo-hardening type photoresist) is film-like coated on a predetermined portion or portions of the wafer surface, and then the baking and developing treatments are performed.

As the developing treatment devices of this kind, there have hitherto been known a liquid blowing-up type device, a liquid spraying type device and a liquid spreading type device. The liquid blowing-up type device is, as shown in FIG. 6, constituted basically by a cup-shaped basin 10 having an inlet passage 11 for etching liquid at its lower portion and a chuck 20 provided above the basin 10 for holding a wafer S by pneumatic attraction. The passage 11 of the basin is connected to a pipe 12 for feeding the treatment liquid. An upper portion 13 of the basin is circular in shape and the liquid flows out over the upper portion of the basin. The lower portion of the basin 10 is provided on its outer periphery with a cylindrical guide 14 which serves as a guide for the flow of liquid.

The chuck 20 is vertically supported and a passage 21 is provided to extend along its center axis, and the passage is communicated at its upper end with a vacuum conduit 22. The conduit 22 has a pressure sensor 23 and a valve 24 which has an inlet pipe 25 for nitrogen gas and a pipe 26 for communication with a vacuum device. If desired, the chuck 20 is arranged so that it is rotatably driven by an electric motor 27 through a belt 28. There are further provided a holder 29 for enclosing the chuck and gas inlet port 30 formed in its appropriate position. The film on the wafer supported by the chuck 20 is developed with developing liquid blown up against the same.

The liquid spraying type device is diagrammatically shown in FIG. 7 and is arranged so that developing liquid is atomized by and sprayed from a nozzle 31 onto the wafer S for development. The liquid spreading type device is also shown in FIG. 8 in a diagrammatic illustration and is arranged so that an appropriate amount of developing liquid is dropped onto the center of the wafer, the dropped liquid then flowing thereon towards the peripheral edge and being held on the wafer surface under the action of surface tension.

These conventional devices described above have such drawbacks and problems as will be pointed out below. The developing liquid has, as its principal component, tetramethyl choline, or tetramethyl ammonium and hydroxide, or so, and such a developing liquid is disposed of at every developing treatment. In the liquid blowing-up type device, therefore, there is a problem that the continuous flow and blowing-up of developing liquid will result in a large or wasteful consumption thereof and in an increase in the production cost of the wafers. In the liquid spraying type device, there is another problem that the size of the liquid particles is often larger than that of the pattern to be developed, and this will result in an uneven development and in a decrease in the resolving power. In the liquid spreading type device, there is a further problem that the central area of the wafer to which developing liquid is dropped is developed by fresh liquid under a certain pressure and the liquid becomes degraded while flowing towards the periphery of the wafer and the reaction pressure and velocity vary in the central and peripheral areas of the wafer, which results in an uneven development.

SUMMARY OF THE INVENTION

It is, therefore, an object of the present invention to solve the abovementioned drawbacks and problems of the prior art and thus to provide a device for developing treatment of semiconductor materials in which the wasteful consumption of the developing liquid and the occurrence of uneven development are avoided and a uniform development with a high resolving power can be achieved.

A device for developing treatment of a semiconductor material or wafer in accordance with the invention is characterized by comprising a cupshaped basin having a liquid inlet passage in its center portion and an annular flat surface on its upper portion, a chuck for attracting and supporting the wafer on it, the liquid inlet passage being provided with a valve for interrupting the flow of liquid therethrough and the upper portion of the basin being provided with a ring having a diameter larger than the size of the wafer to be developed, whereby the liquid supplied to the upper portion is temporarily stored within the ring.

With such arrangement, when one semiconductor material or wafer is developed, it is supported on the lower end surface of the chuck and closely positioned and opposed to the upper portion of the basin. Simultaneously therewith or prior or posterior thereto, the valve is opened to cause the flow of the developing liquid upward through the passage, thereby filling the inner space of the ring with the liquid. The valve is then closed so that the liquid is temporarily stored within the ring, and the wafer supported by chuck is developed by the liquid stored within the ring. When the developing treatment for said one wafer has been completed, the liquid within the ring is discharged and replaced by fresh liquid for a subsequent developing treatment.

DETAILED DESCRIPTION OF THE INVENTION AND THE PREFERRED EMBODIMENTS

The invention will now be described with reference to the preferred embodiments shown in the accompanying drawings.

Figure 1:
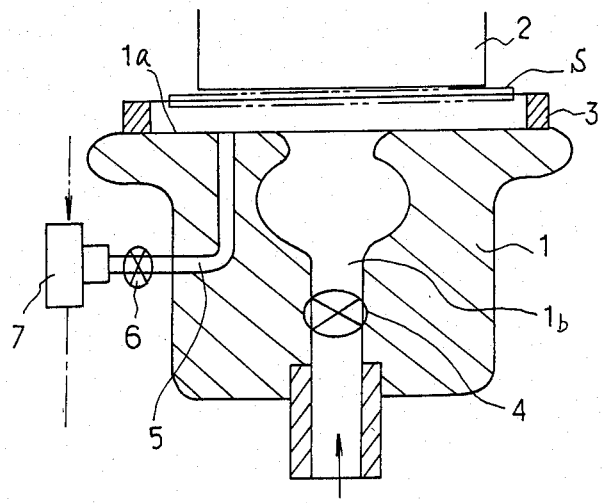
FIG. 1 is a sectional elevation showing an essential portion of a device for developing treatment of a semiconductor material in accordance with the invention.
Figure 2:
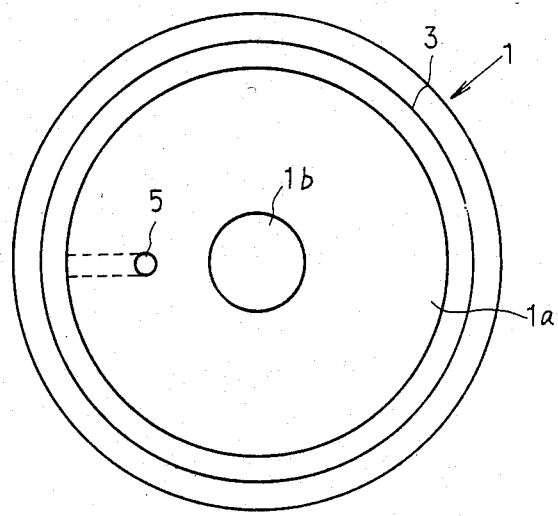
FIG. 2 is a plan view of the device of FIG. 1.
Figure 6:
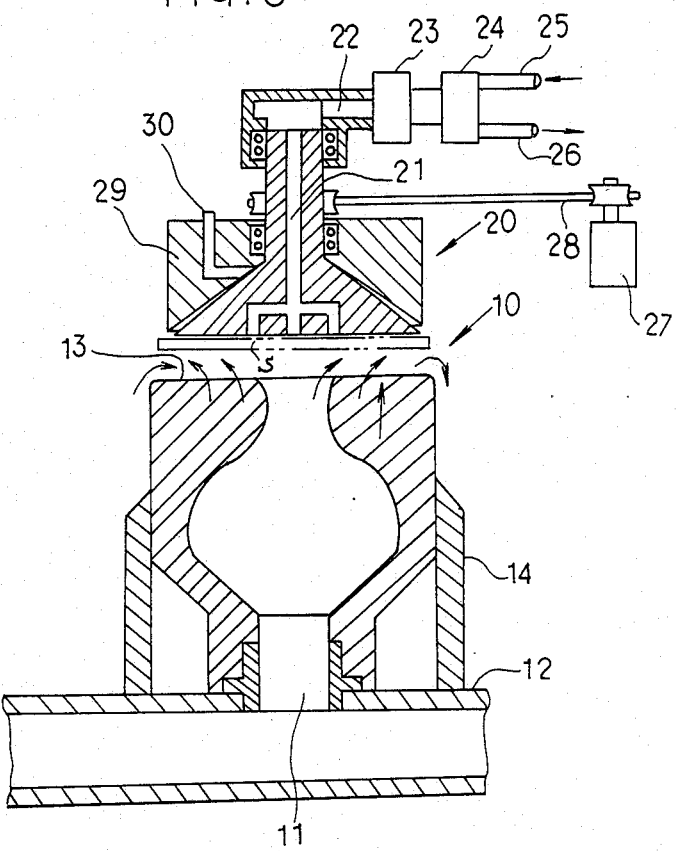
FIG. 6 is a sectional view of a conventional treatment device.
Figure 7:
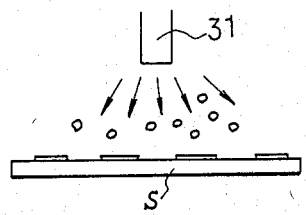
FIGS. 7 and 8 are illustrations showing different conventional devices.
Figure 8:
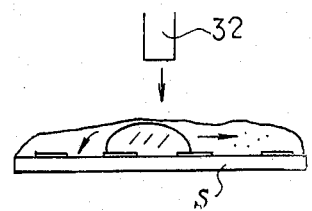

FIGS. 1 and 2 show an embodiment of the invention. As shown, the device comprises a generally cup-shaped basin 1 having a flat upper portion 1a and a chuck 2 located above the basin 1 and having a lower end surface for pneumatically attracting and supporting a wafer S. No description on the chuck 2 is given herein, because the chuck 2 is arranged and functions similar to the chuck 20 of the conventional device shown in FIG. 6 and described above. However, the chuck 2 may have a different construction suitable for supporting a wafer. The basin 1 is formed at its center portion with a passage 1b for the developing liquid extending therethrough from the lower portion to the upper portion.

The specific arrangement of this device is that a ring 3 is provided on the upper portion 1a of the basin 1 so that the developing liquid is temporarily stored within an inner space of the ring 3, and an electromagnetic valve 4 is provided in the passage 1b for interrupting the flow of liquid therethrough. As shown in FIG. 1, the ring 3 has a diameter larger than the size of the wafer to be developed, so that the wafer can be positioned within the inner space of the ring 3. In order to storing the liquid within the ring 3, the lower end surface of the ring 3 is adapted to be sealingly contacted with the surface of the upper portion 1a of the basin 1, and if necessary, a suitable sealing material, such as rubber ring, can be disposed on the lower end surface of the ring. The ring 3 is formed of a suitable material which does not react with the developing liquid. For example, the basin 1 is formed of a resin, such as polypropylene, and the ring 3 is also formed of the same resin.

After developing treatment, the liquid within the ring 3 is discharged. For this purpose, in the embodiment shown in FIG. 1 the basin 1 is provided with a liquid discharging passage 5 which opens at its one end to the upper portion 1a of the basin. The liquid discharging passage 5 is provided with an electromagnetic valve 6 in an appropriate position, and the other end of the passage 5 is connected to an aspirator 7.

In this embodiment, as shown in FIG. 1 the wafer S is supported on the lower end surface of the chuck 2 and then positioned close to the upper portion 1a of the basin 1. Simultaneously therewith or prior or posterior thereto, the electromagnetic valve 4 of the passage 1b is operated to open so that the developing liquid flows upward therethrough into the inner space of the ring 3 until the space is filled with the liquid, and then the valve 4 is closed for maintaining in this condition that the liquid is fully stored within the ring 3 during the time when the wafer is being developed for normally about 18 to 60 seconds. Therefore, the valve 4 serves to supply a predetermined amount of liquid to the inner space of ring. At this time, the electromagnetic valve 6 of the liquid discharging passage 5 is closed. When the developing treatment has been completed, the valve 6 opens and water or air flows through the aspirator 7 to discharge the liquid on the upper portion of the basin 1 through the passage 5. The operation of these electromagnetic valve is electrically controlled by suitable sensor means.

Figure 3:
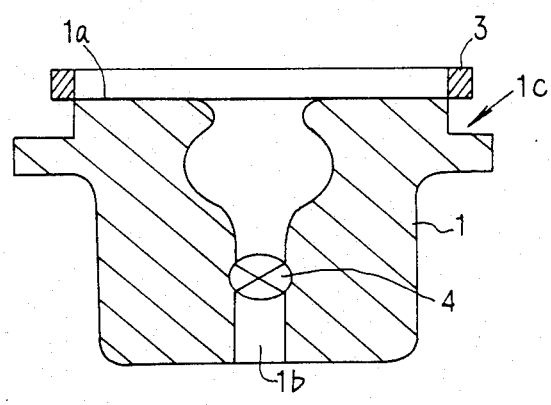
FIG. 3 is a sectional elevation of another device according to the invention.

FIG. 3 shows a second embodiment in which the upper portion 1a of the basin 1 is provided with a circular stepped portion 1c for receiving the ring 3, and after discharge of the developing liquid the ring 3 is downwardly moved and brought into engagement with the stepped portion 1c.

Figure 4:
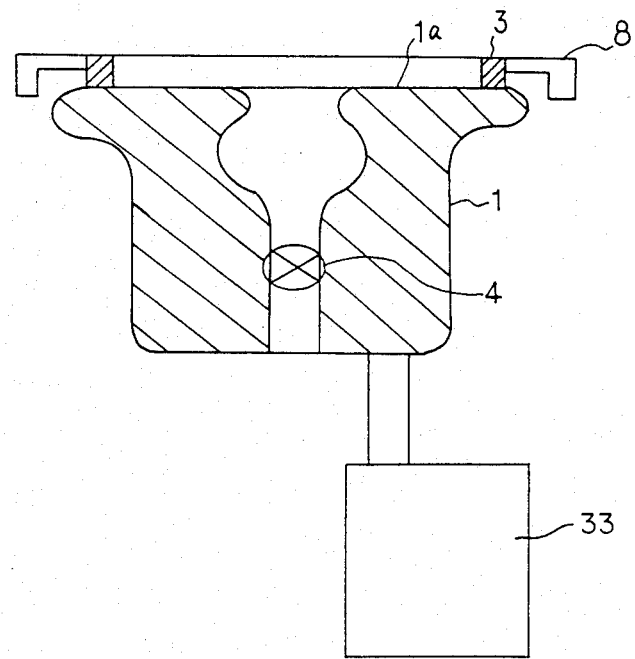
FIG. 4 is a partially schematic sectional elevation of a different embodiment of the invention.

Alternatively, as shown in FIG. 4, the ring 3 is supported by a separate member 8 from the basin 1, and the basin 1 is slightly downwardly moved by a suitable means, such as pneumatic cylinder 33, to discharge the liquid on the upper portion of the basin.

Figure 5:
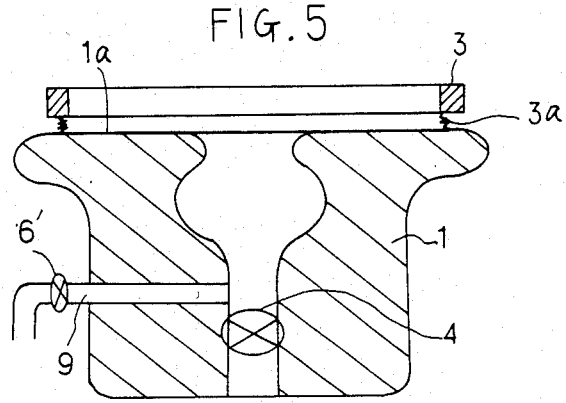
FIG. 5 is a sectional elevation of another different embodiment of the invention.

Furthermore, the device can be arranged as shown in FIG. 5 in which a liquid discharging passage 9 is provided for communication with the passage 1b above the electromagnetic valve 4 and the passage 9 is provided with an electromagnetic valve 6'. The ring 3 is provided on its lower end surface with a bellows type sealing member 3a.

In the embodiments described above, the electromagnetic valves can be substituted for by other types of valves which are automatically operable similar to the electromagnetic valves.

With the arrangement described above, the present invention brings forth the advantage and effect that the wafer is developed by the developing liquid stored within the ring on the upper portion of the basin and this results in the fact that even and uniform development of the wafer can be achieved, and a predetermined amount of liquid is applied to each of the wafers and this also results in the fact that wasteful consumption of the developing liquid can be avoided.

What is claimed is:

1. An apparatus for developing semi-conductor materials comprising:
   a cup-shaped basin having a center portion and an annular flat upper portion, said center portion having a liquid inlet passage, said inlet passage having an upper end; and
   a chuck positioned above said basin, said chuck having a lower end surface for attracting and supporting, under vacuum, the semi-conductor material to be developed; and
   a ring provided on said upper portion of said basin to temporarily store developing liquid supplied to said upper portion, said ring having a diameter larger than the size of said semi-conductor material; and
   a first automatically operable valve provided in said liquid inlet passage located below said upper end of said liquid inlet passage; and
   discharge means communicating with said basin for discharging developing liquid.

2. An apparatus according to claim 1, wherein said discharge means comprises:
   a liquid discharging passage, said discharging passage having a first and second end, said first end communicating with said upper end of said basin; and
   a second automatically operable valve provided in said liquid discharging passage; and
   an aspirator connected to said second end of said liquid discharging passage.

3. An apparatus according to claim 1, wherein said discharge means comprises:
   a liquid discharging passage, said discharging passage having a first and second end, said first end communicating with said liquid inlet passage between said upper end of said inlet passage and said first automatically operable valve; and an aspirator connected to said second end of said liquid discharging passage.

4. An apparatus according claim 1, wherein the discharge means is an annular groove provided on said upper portion of said basin for receiving said ring and for discharging developing liquid.

5. An apparatus according to claim 1, wherein the discharge means is provided by a separate member extending upwardly from said upper portion of said basin such that said ring is supported by said separate member and said basin being downwardly displacable so as to allow the discharge of developing fluid.

* * * * *